United States Patent
Tran et al.

(10) Patent No.: US 6,395,972 B1
(45) Date of Patent: May 28, 2002

(54) METHOD OF SOLAR CELL EXTERNAL INTERCONNECTION AND SOLAR CELL PANEL MADE THEREBY

(75) Inventors: Dean Tran, Westminster; George J. Vendura, Jr., Rossmoor; Mark A. Kruer, Redondo Beach; Alan M. Hirschberg, Thousand Oaks, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/710,532

(22) Filed: Nov. 9, 2000

(51) Int. Cl.$^7$ .............................................. H01L 31/048
(52) U.S. Cl. ..................... 136/251; 136/244; 136/256; 438/64; 438/66; 438/80; 438/98; 257/433; 228/227; 228/42
(58) Field of Search ................... 136/244, 251, 136/256; 438/64, 66, 80, 98; 257/433; 228/227, 42

(56) References Cited

U.S. PATENT DOCUMENTS

| | | | |
|---|---|---|---|
| 4,364,508 A | * 12/1982 | Lazzery et al. | ............. 228/106 |
| 4,685,608 A | * 8/1987 | Kujas | ........................... 228/227 |
| 5,115,964 A | * 5/1992 | Ameen et al. | ......... 228/180.22 |
| 5,252,141 A | * 10/1993 | Inoue et al. | ................. 136/251 |
| 5,467,912 A | * 11/1995 | Mishina et al. | ................ 228/10 |

FOREIGN PATENT DOCUMENTS

JP    61-116882 A   *  6/1986

* cited by examiner

Primary Examiner—Alan Diamond
(74) Attorney, Agent, or Firm—Antonelli, Terry, Stout & Kraus LLP

(57) ABSTRACT

A method of solar cell external interconnection and a solar cell panel (1) made thereby are disclosed. An assembly (2) including a solar cell module (4), a flexible lead frame (5) to which the solar cell module is to be interconnected and a solder located between the solar cell module and the flexible lead frame, is provided. The solder is heated by directing a hot gas (42) into the area of the solder to melt the solder and form a soldered connection (6) between the solar cell module and the lead frame. The soldered assembly is attached to a module carrier panel (3) by embedding a portion of the assembly in a first, flexible adhesive (32) and another portion of the assembly in a second, thermally curable adhesive (33) which is then cured to anchor the assembly on the module carrier panel.

25 Claims, 5 Drawing Sheets

METHOD OF SOLAR CELL EXTERNAL INTERCONNECTION AND SOLAR CELL PANEL MADE THEREBY

TECHNICAL FIELD

The invention relates to a method of solar cell external interconnection and a solar cell panel made by the method.

BACKGROUND

There is a need for an improved method to electrically interconnect ultra-thin glass solar cell arrays to a carrier panel for a spacecraft, for example, with little or no damage to the solar cells or the interconnections thereof with the carrier. Present methods of ultra-thin glass solar cell array attachment and interconnection, including thermal compression and ultrasonic bonding, can damage the solar cell PN junction and also the glass because the high temperature and/or pressure bonding probe directly contacts the solar cell PN junction during the solar interconnection process.

Another problem with present methods is that the RTV silicone adhesive used to attach the solar cells to the carrier takes hours to cure. This curing time prevents fast automated solar cell connection to the carrier. The adhesive also does not permit tight tolerance manufacturing processes. Even if the solar cell is held in place during the conventional bonding process to speed up the attachment of the solar cells to the carrier, the high temperature probe in thermal compression bonding damages the RTV silicone adhesive attachment because the adhesive cannot withstand the temperature of the bonding probe.

SUMMARY

The improved method of solar cell external interconnection and the solar cell panel made thereby according to the present invention avoid the aforementioned problems. The bonding force in the disclosed embodiment of the method is reduced in comparison with the conventional methods while the heat for bonding is localized at the bond area(s) and is applied for only a very short time. More specifically, a method of a solar cell external interconnection according to the invention comprises providing an assembly including a solar cell module, a flexible lead frame to which the solar cell module is to be interconnected and a solder located between the solar cell module and the flexible lead frame.

The solder is heated by directing a hot gas into the area of the solder to melt the solder and form a soldered connection between the solar cell module and the lead frame.

In the disclosed embodiments, the solder is provided at a plurality of discrete sites between the solar cell module and the flexible lead frame and a plurality of soldered connections are formed at the same time during the heating.

The soldered assembly is then attached to a module carrier panel by applying a first, flexible adhesive and a second, thermally curable adhesive to respective areas of the module carrier panel. The soldered assembly is placed on the adhesives on the module carrier panel to embed a portion of the assembly in the flexible adhesive and another portion of the assembly in the thermally curable adhesive. The assembly and module carrier panel are heated to cure the thermally curable adhesive to anchor the assembly on the modular carrier panel.

A solar cell panel according to the invention comprises an assembly of at least one solar cell module and a flexible lead frame connected to the solar cell module by at least one soldered connection. A module carrier panel is attached to the assembly in respective areas by a first, flexible adhesive in which a portion of the assembly is embedded and a second, thermally cured adhesive anchoring the assembly on the module carrier. In one form of the invention, a plurality of the assemblies are attached to the module carrier panel with the lead frames of at least two adjacent assemblies being connected to one another by a pin connection. In another form of the invention, a plurality of solar cell modules are each connected with the flexible lead frame by at least one soldered connection and, in turn, attached to the module carrier panel without pin connection. The solar cell modules can be connected in series or parallel in the solar cell panels, with or without pin connection.

These and other objects, features and advantages of the present invention will become more apparent from the following detailed description of several embodiments of the invention taken with the accompanying drawings.

DETAILED DESCRIPTION

Figure 4:
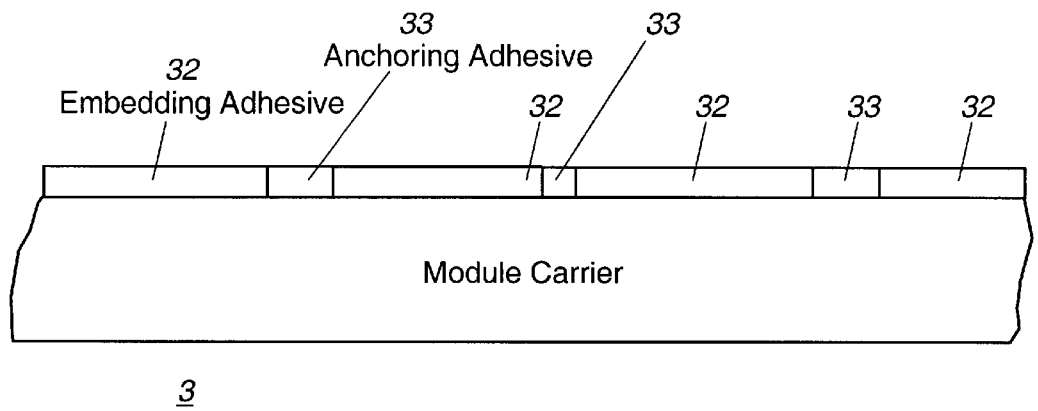
FIG. 4 is a cross section of a module carrier panel of the invention, a first, embedding adhesive and a second, anchoring adhesive having been applied in respective areas of one surface of the carrier panel.
Figure 5:
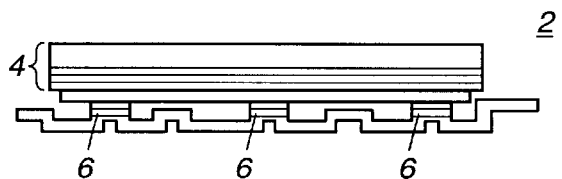
FIG. 5 is a cross section of a soldered assembly of the invention formed by the solar cell module of FIG. 1 and the flexible lead frame of FIG. 2.
Figure 6:
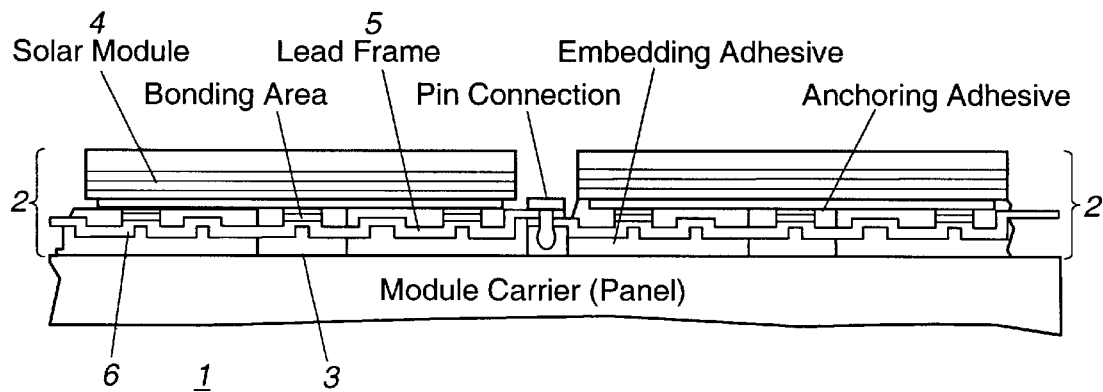
FIG. 6 is a cross section of a portion of a solar cell panel according to the invention having a serial connection wherein two adjacent assemblies as in FIG. 5 are attached to the module carrier of FIG. 4 and interconnected by a pin connection using the connection pin of FIG. 3.

Referring now to the drawings, a solar cell panel 1 according to the invention is shown in FIG. 6. The solar cell panel 1 comprises a plurality of assemblies 2 as shown in FIG. 5, attached to a module carrier panel 3, illustrated in FIGS. 4 and 6. Each assembly 2 of the solar cell panel 1 comprises a solar cell module 4, FIGS. 1, 5 and 6, and a flexible lead frame 5 connected to the solar cell module 4 by a plurality of discrete soldered connections 6, see FIGS. 5 and 6.

The solar cell modules 4 in the disclosed embodiment are amorphous silicon, III–V, II–VI, or any other suitable material solar cell structure grown on thin glass. The solar structures are conventional and not further described herein. The solar cell module 4 in the illustrated embodiment has dimensions of about 6"×12"×3 mils. The dimensions of the module can be varied, but are preferably within the range from 3"×3" to 24"×48" with thicknesses ranging from 3 mils to 250 mils. The larger module requires a greater thickness for resistance to process handling problems.

The flexible lead frame 5 is formed of a conductive metal. Examples of suitable materials are copper, copper alloy, copper-Invar (iron-nickel (36%) - copper (copper-clad-Invar) or copper-molybdenum-copper (copper-clad molybdenum) or aluminum, aluminum alloy or other applicable metal of low electrical expansion and high electrical conductivity, such as silver-clad composites, etc. The thickness of the metal lead frame 5 is from 1 mil to 25 mils. The strip line width and length in the lead frame depend on the solar cell dimensions, for example, with a ⅝" solar cell width, the strip line width is 125 mils to 250 mils or larger. The strip line length depends on the length of the solar cell and how many solar modules are connected to form a solar cell panel. For example, fabricating a 14"×36" solar sub-panel with six solar cell modules measuring 6"×12"×3 mils requires the length of the strip lines to be long enough to cover the length of the sub-panel.

Figure 1:
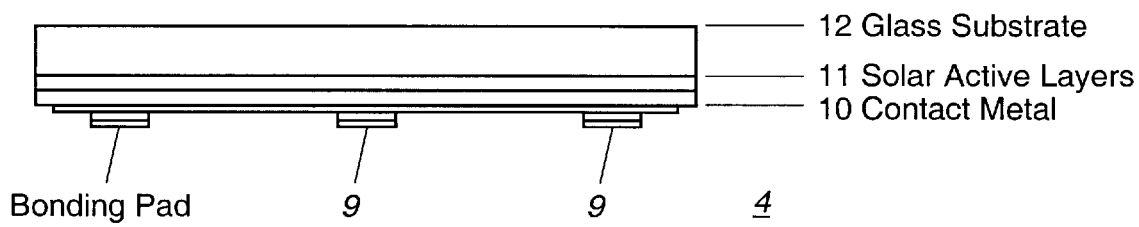
FIG. 1 is a cross section of a solar cell module to be externally interconnected in accordance with the present invention.
Figure 2:
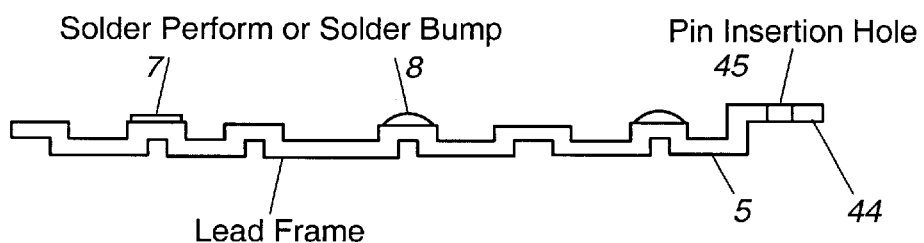
FIG. 2 is a cross section of a flexible lead frame having solder on selected portions thereof for bonding to the solar cell module of FIG. 1.

The soldered connections 6 between the solar cell module 4 and the lead frame 5 are formed by first applying solder locally at a plurality of discrete sites and then placing the solar cell module 4 on the lead frame 5 and heating the solder by directing hot gas into the area of each site to melt the solder and form the soldered connections 6 shown in FIG. 5. The solder can be applied to the lead frame 5 in the form of a solder preform 7 or a solder ball or bump 8 as shown in FIG. 2. In the disclosed example, the soldered connections 6 are made at respective bonding pads 9 located on contact metal 10 over solar active layer 11 and glass substrate 12 of the module 4 as illustrated in FIG. 1. The solar cell module may be fabricated without bonding pads, in which case the soldered connections are made directly on the contact metal 10.

The solder for forming the soldered connections 6 between the lead frames and solar cell modules is preferably 80 gold-20 tin alloy having a liquidous temperature $T_{liq}$ of 280° C. Alternatively, the solder could be 99 tin-1 copper alloy having a liquidous temperature $T_{liq}$ of 255° C. or tin-2-3.5 silver with a $T_{liq}$=230–221° C. or other applicable solder. A eutectic solder composition is preferred for minimizing the liquidous temperature. In the case the solder is applied in the form of a solder preform 7, the annular preforms 7 have a diameter from 75 mils to 125 mils depending on the strip line width of the associated lead frame. The thickness of the solder preform is from 2 to 10 mils.

Figure 8:
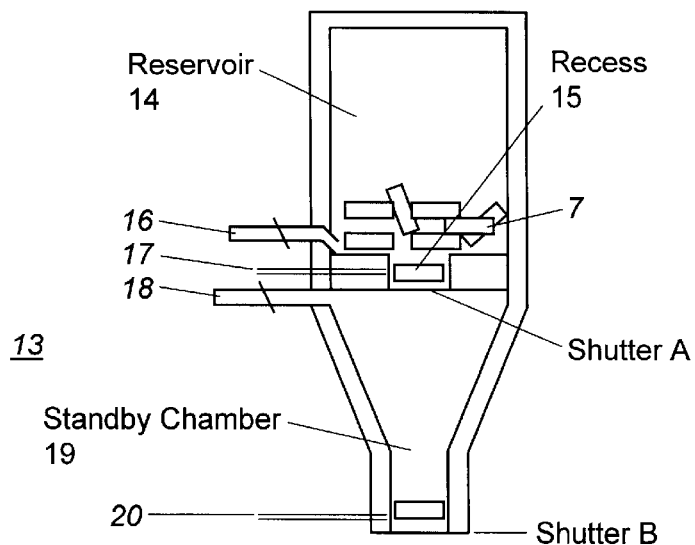
FIG. 8 is a schematic drawing of a solder preform placing apparatus to inject a solder preform on the lead frame of FIG. 2.

The solder preforms 7 are placed on the lead frame 5 using the auto shot apparatus 13 shown schematically in FIG. 8. The reservoir 14 of the apparatus 13 is filled with the precut preforms 7. A preform is injected into a designated place on lead frame 5 from the apparatus 13 automatically by computer control. To this end, first, a nitrogen nozzle 16 blows for 1 millisecond or so until one preform 7 goes into recess 15 of the reservoir. This preform is detected by photosensor 17. A shutter A of the apparatus is opened and one preform is dropped to standby position. The preform injection head of apparatus 13 is moved to the designation position over the lead frame 5 by computer control according to conventional processes for positioning. The shutter B is then opened at the same time nitrogen nozzle 18 is opened to increase the pressure slightly in the standby chamber 19 which then drops the preform from the standby position to the desired place on the underlying lead frame. Finally, the empty standby position is detected by a photosensor 20 and the cycle is started again.

Figure 9:
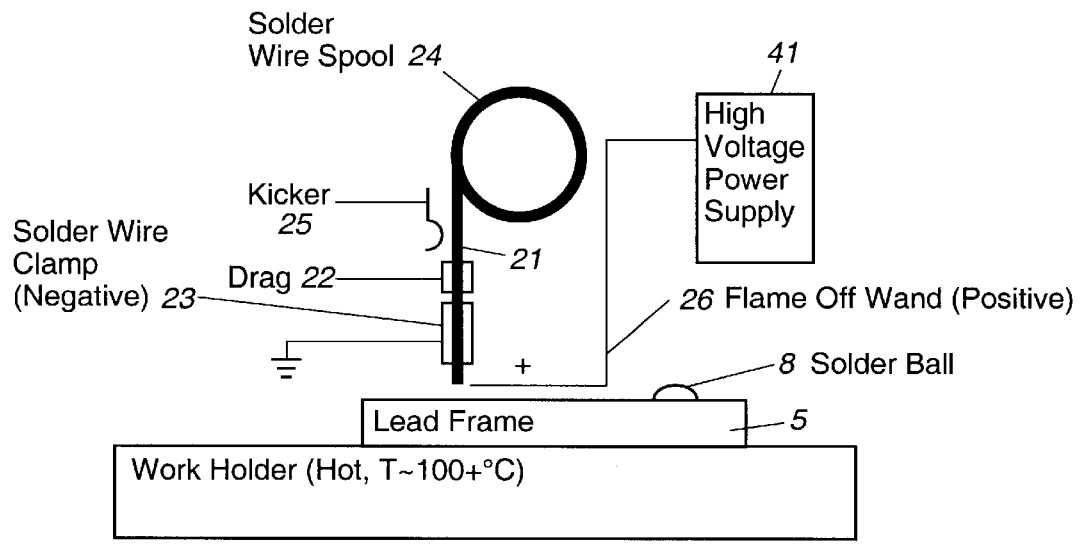
FIG. 9 is a schematic drawing of an arrangement for using wire solder and an electrical flame-off technique to apply a solder ball to the flexible lead frame of FIG. 2.

The solder can also be placed on the lead frame 5 in the form of a solder bump or ball 8 using a wire solder 21 and an electrical flame-off technique as illustrated schematically in FIG. 9. In this process, a drag 22 and a solder wire clamp 23 acting on the wire solder 21 from solder wire spool 24 are opened. A kicker 25 kicks the wire down and the clamp 23 closes. The solder dispensing head in FIG. 9 descends until the tip of the wire is above the lead frame, to about 200 mils, at the designated position over the lead frame 5.

A flame-off wand 26 is then kicked in under the solder wire but not touching the wire. A high voltage from a power supply 41 is applied to the flame-off wand and an electrical spark is thereby generated which melts the solder wire 21 and forms the solder ball 8. Immediately, within a millisecond, the high voltage supply 41 is turned off and at the same time the dispensing head of the apparatus goes down further, toward the lead frame, until the solder ball hits the lead frame and bonds to the lead frame. The clamp 23 is still in its closed position. The dispensing head is pulled up and breaks the solder wire at the ball neck leaving a solder bump or ball 8 on the lead frame 5. The cycle is started repeatedly until all bonding positions have solder bumps. Multiple heads can be arranged in the 90° direction with the frame moving direction so that one row of dots/preforms can be placed at one time.

Figure 7:
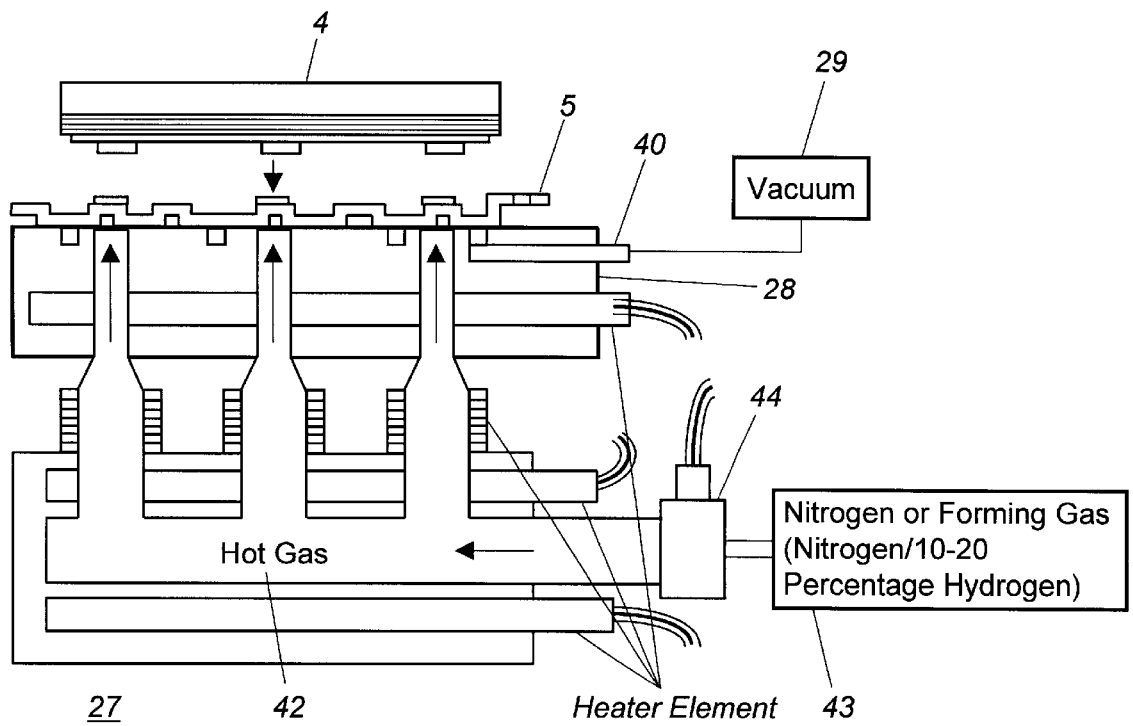
FIG. 7 is a schematic illustration of an apparatus for delivering hot gas locally to a plurality of bonding sites for soldering the lead frame and solar cell module of FIGS. 1 and 2 according to the invention.

An arrangement 27 for heating the solder by directing hot gas locally into each of the plurality of discrete sites to be soldered to melt the solder and form a plurality of soldered connections between the solar cell module and the lead frame can be seen in FIG. 7. The arrangement 27 includes a hot work holder 28 which is heated to a temperature of 100–200° C. depending on the solder liquidous temperature. The lead frame 5 with solder thereon is placed on the work holder 28. A vacuum from a vacuum source 29 is connected to a vacuum hole 40 in the work holder for holding the lead frame in place.

The solar cell module 4 is transferred and aligned on the lead frame. The module 4 is also vacuumed down slightly on the lead frame by a vacuum hole connected to the vacuum source 29. At the same time, hot gas 42 is blown from a gas supply 43 by a blower 44 through passages and heater elements in hot work holder 28 so that the hot gas will be injected locally on s the bonding areas on the lead frame side of the assembly 2. The hot gas melts the solder in a relatively short period of time, in approximately 3 to 10 seconds. The liquid solder diffuses on the lead frame and module bonding pad (or contact metal). Upon completion of the hot gas solder bonding process, the assembly 2 of the module 4 and flexible lead frame 5 is removed from the arrangement 27 to a cool plate and transferred to a position for adhesive bonding to the module carrier panel 3.

The hot gas in the disclosed embodiment is preferably nitrogen or nitrogen with 10–20% hydrogen. The temperature of the hot work holder 28 is preferably set at a temperature below the solid temperature of the solder, approximately 10–20% lower. The gas temperature in the area of the solder is set above the liquidous temperature of the solder, approximately 50–60% higher. The work holder 28 has two sets of grooves on its surface for a vacuum: one long strip groove for holding down the lead frame and another, spiral pattern groove for vacuuming down the solar module 4 against the lead frame during soldering. Each of the grooves communicates by way of a respective vacuum hole in the work holder to the vacuum source 29.

Each of a plurality of the soldered assemblies 2 is attached and anchored to the module carrier panel 3 using flexible adhesive for the entire cell array thereof except where anchors are attached, and thermal adhesive is used only where the anchors attach. This is illustrated in FIG. 4, wherein the module carrier panel 3 is coated in areas 32 with embedding adhesive and areas 33 with anchoring adhesive. An example of an embedding adhesive useful in the method of the invention is RTV (silicone) adhesive. An example of the anchoring adhesive, a thermally curable adhesive, useful in the process is Epo-Tek T6116, an epoxy adhesive or similar thermal adhesive. The module carrier panel 3 is formed of Duroid (Teflon filled ceramic) board in the disclosed embodiment. However, other suitable materials can be used.

Figure 3:
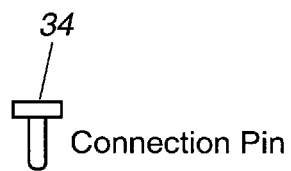
FIG. 3 is a perspective view from the side of a connection pin for interconnecting adjacent assemblies of solar cell modules and lead frames of the invention to one another on a module carrier panel of the invention.

The lead frames 5 of individual assemblies 2 according to one form of the invention are connected to one another on the module carrier 3 by a pin connection process. This is accomplished by placing two ends 44 of adjacent lead frames in overlapping relation. Holes 45 are punched in the ends 44 of the lead frames at the time of forming the lead frame by a stamped cut process. The holes 45 are aligned when the assemblies are placed on the module carrier panel 3. The alignment process is performed automatically with control by an optical sensor and reference alignment marks. A light source is launched into the alignment marks. An X-Y motor is activated for alignment. When the two holes are aligned, the light beam will get through the lead frame material and its reflection intensity is reduced. This reduction is detected by a photosensor. Then, a miniature copper (or equivalent material) connection pin 34, see FIG. 3, is inserted (snapped) into the hole. Finally, a dot of thermal epoxy, such as ME-7155 or silicone adhesive such as RTV-1642, is injected on top of the pin to secure the pin in place, other suitable non-electrical conductive epoxy or adhesive may be used. This thermal epoxy will be cured at the epoxy curing process for anchoring the assemblies to the module carrier panel 3.

Figure 10:
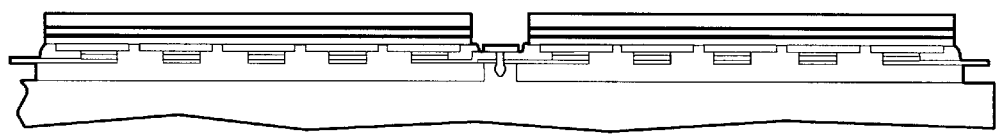
FIG. 10 is a cross section of a portion of a solar cell panel according to the invention having a parallel connection wherein two adjacent assemblies according to the invention are attached to a module carrier and interconnected by a pin connection.
Figure 11:
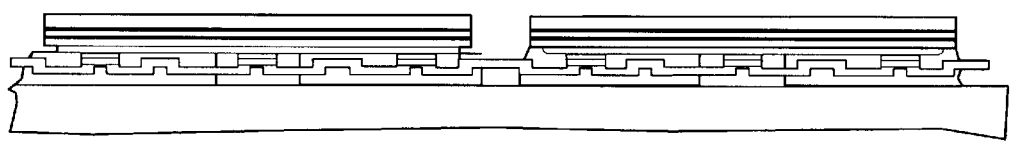
FIG. 11 is a cross section of a portion of another solar cell panel according to the invention having a continuous serial connection without pin connection between adjacent solar cell modules.
Figure 12:
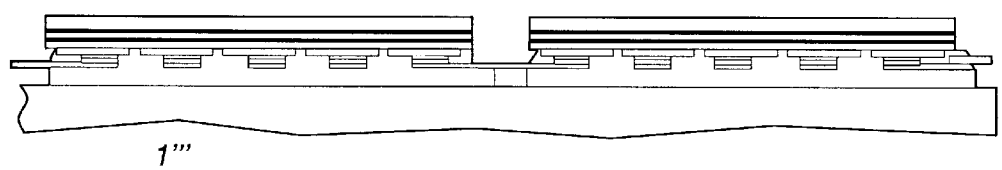
FIG. 12 is a cross section of a portion of a further solar cell panel of the invention having a parallel connection without pin connection between adjacent solar cell modules.
Figure 13:
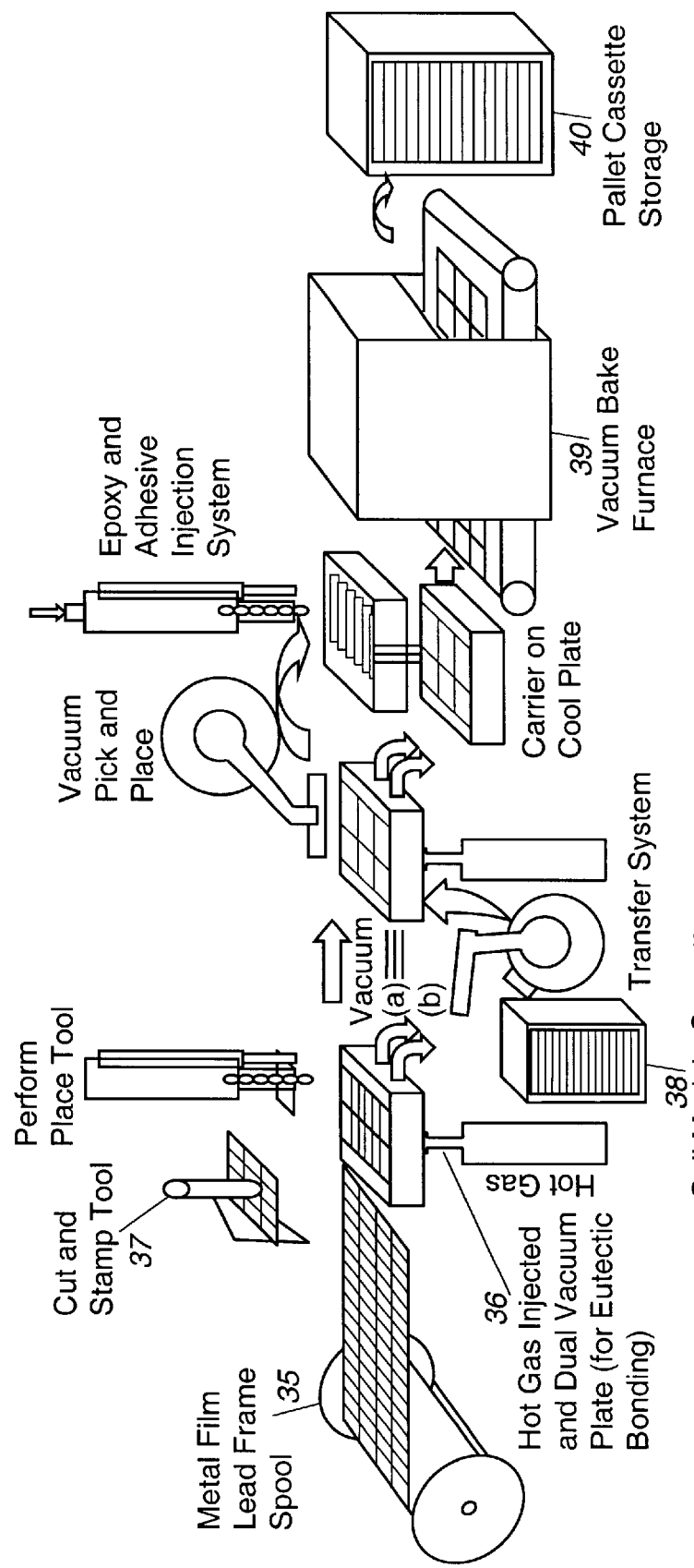
FIG. 13 is a schematic flow diagram of the steps of the method according to an embodiment of the invention and the apparatus utilized therein for making a solar cell panel according to the invention.

Solar cell panels 1 and 1' with pin connections are shown in FIGS. 6 and 10 for a serial connection and a parallel connection, respectively. Panels 1' and 1" with continuous serial connection without pin connections and with parallel connection without pin connection, according to the invention, are illustrated in FIGS. 11 and 12, respectively. The process for making the solar cell panels without pin connections is the same as with pin connections except instead of forming lead frames for The solar cell panels and method of making the same according to the invention advantageously lend themselves to an automatic, high throughput, mass-production method of bonding down solar modules and interconnecting them into panels/wings. To this end, as shown in FIG. 13, a continuous strip of flexible lead frame can be pulled from metal film lead frame spool 35 to a hot gas bonding work station 36 where the lead frame is vacuumed down and cut and stamped using a cut and stamp tool 37. Solder is applied on bonding pads of the lead frame using one of both of the apparatus of FIGS. 8 and 9.

Solar cell modules 4 are picked from cell module cassette 38 and placed on the lead frame using a robot arm and optical sensor. The solar modules are vacuumed down against the lead frame so that a relatively low pressure, less than atmospheric pressure, is applied on the assembly during bonding. Hot gas is then injected into the areas of the solder for a relatively short period of time, approximately 3–10 seconds, to perform soldering as discussed previously. Flexible adhesive 32 and thermal adhesive 33 are injected on respective areas of the module carrier panel 3. The soldered modules are picked up from the bonding station and placed on the module carrier panel and a pressure is applied on them using a robot arm and optical alignment sensor. The panels are transferred to vacuum bake furnace 39 for curing. The solar cell panels are then unloaded from the furnace 39 to a pallette cassette 40 for further processing steps.

The fully automatic surface mount assembly capability and large volume production of the method of the invention result in low cost. Thousands of bonds can be performed within five minutes, for example, as compared with one minute for one bond of the present technology. A high yield is also attained as the human factor in the assembly line is reduced with the method of the invention.

While we have shown and described only several embodiments of the present invention herein, it will be readily understood by the skilled artisan that variations of the solar cell panel and also the method of solar cell external interconnection are possible without departing from the scope of our invention. Therefore, we do not wish to be limited to the details shown and described herein but intend to cover all such changes and modifications as are encompassed by the scope of the appended claims.

We claim:

1. A method of solar cell external interconnection comprising:

providing an assembly including a solar cell module, a flexible lead frame to which said solar cell module is to be interconnected and a solder located at a plurality of discrete sites between said solar cell module and said flexible lead frame, and heating said solder by directing a hot gas locally into the area of said solder at each of the discrete sites only from the lead frame side of the assembly to melt said solder and form a plurality of soldered connections between said solar cell module and said lead frame.

2. The method according to claim 1, including holding the lead frame on a hot work holder having passages through which the hot gas is injected to the plurality of discrete sites on the lead frame side of the assembly for forming the soldered connections.

3. The method according to claim 2, wherein said hot work holder includes a vacuum hole, and wherein a vacuum is drawn through the vacuum hole to hold down the lead frame on the work holder during soldering.

4. The method according to claim 1, wherein said providing includes placing a preform of said solder on said lead frame to which said solar cell module is to be interconnected.

5. The method according to claim 1, wherein said providing includes using a wire solder and an electrical flame-off technique to bond a solder bump to said lead frame to which said solar cell module is to be interconnected.

6. The method according to claim 1, wherein said assembly includes a plurality of solar cell modules with solder provided between respective ones of said modules and said lead frame and wherein soldered connections are formed between said modules and said lead frame during said heating.

7. The method according to claim 1, wherein said solder has a eutectic solder composition.

8. The method according to claim 1, wherein said heating to melt said solder and form said soldered connections is performed in approximately 3 to 10 seconds.

9. The method according to claim 1, including applying a relatively low bonding force to said assembly during said heating by applying a vacuum to at least one of said solar cell module and said lead frame.

10. The method according to claim 1, further comprising attaching the soldered assembly to a module carrier panel.

11. The method according to claim 10, wherein said attaching includes embedding said soldered assembly in a flexible adhesive provided on said module carrier panel.

12. The method according to claim 10, wherein said attaching includes anchoring said soldered assembly to said module carrier panel by way of a thermally curable adhesive.

13. The method according to claim 10, wherein said attaching includes applying a first, flexible adhesive and a second, thermally curable adhesive to respective areas of said module carrier panel, placing said soldered assembly on the adhesives on said module carrier panel to embed a portion of said soldered assembly in said flexible adhesive and a soldered connection of said soldered assembly in said thermally curable adhesive, and heating said soldered assembly and said module carrier panel to cure said thermally curable adhesive to anchor said soldered assembly on said module carrier panel.

14. The method according to claim 10, including attaching a plurality of the soldered assemblies to said module carrier panel and interconnecting the lead frames of at least two adjacent assemblies to one another.

15. The method according to claim 14, wherein said interconnecting said lead frames of said soldered assemblies to one another includes overlapping ends of the lead frames of said two adjacent assemblies so that holes formed in each of said two overlapped ends are aligned, and inserting a pin into said aligned holes in said overlapped ends of said lead frames to form a pin connection therebetween.

16. The method according to claim 15, further comprising anchoring said pin connection to said module carrier panel using a thermally curable adhesive.

17. A method of solar cell external interconnection comprising:
  providing a bonded assembly including a solar cell module, a flexible lead frame and at least one bonded connection between said solar cell module and said flexible lead frame, and
  attaching said bonded assembly to a module carrier panel, wherein said attaching includes
    applying a first, flexible embedding adhesive and a second, thermally curable anchoring adhesive to respective areas of a surface of said module carrier panel to which the bonded assembly is to be attached,
    placing said bonded assembly on the adhesives on said module carrier panel to embed a portion of said assembly in said first, flexible embedding adhesive and another portion of assembly in said second, thermally curable anchoring adhesive, and
    heating said assembly and said module carrier panel to cure said second, thermally curable anchoring adhesive to anchor said assembly on said module carrier panel.

18. The method according to claim 17, including attaching a plurality of the bonded assemblies to the module carrier panel and interconnecting the lead frames of at least two adjacent assemblies to one another.

19. The method according to claim 18, wherein the interconnecting of the lead frames of the bonded assemblies to one another includes overlapping ends of the lead frames of the two adjacent assemblies so that holes formed in each of the two overlapped ends are aligned, and inserting a pin into the aligned holes in the overlapped ends of the lead frames to form a pin connection therebetween.

20. The method according to claim 19, wherein the another portion includes the pin connection which is anchored to the module carrier panel using the thermally curable adhesive.

21. The method according to claim 17, wherein the another portion includes a bonded connection between the solar cell module and the flexible lead frame.

22. A solar cell panel comprising:
  an assembly of at least one solar cell module and a flexible lead frame connected to said solar cell module by at least one soldered connection, and
  a module carrier panel having a surface to which said assembly is attached in respective areas of the surface by a first, flexible adhesive in which a portion of said assembly is embedded and a second, thermally cured adhesive anchoring said assembly on said module carrier panel.

23. The solar cell panel according to claim 22, wherein said assembly includes a plurality of solar cell modules each connected with said flexible lead frame by at least one soldered connection.

24. The solar cell panel according to claim 22, wherein a plurality of the assemblies are attached to said module carrier panel, the lead frames of at least two adjacent assemblies being connected to one another.

25. The solar cell panel according to claim 24, wherein the two adjacent assemblies have lead frame ends which overlap one another and are connected to one another by a pin connection.

* * * * *